United States Patent [19]

Jeng et al.

[11] Patent Number: 5,719,418
[45] Date of Patent: Feb. 17, 1998

[54] CONTACT-SUBSTRATE FOR A SEMICONDUCTOR DEVICE COMPRISING A CONTOUR

[75] Inventors: Nanseng Jeng; Steven T. Harshfield; Paul J. Schuele, all of Boise, Id.

[73] Assignee: Micron Technology, Inc., Boise, Id.

[21] Appl. No.: 604,006

[22] Filed: Feb. 20, 1996

Related U.S. Application Data

[62] Division of Ser. No. 209,584, Mar. 11, 1994, Pat. No. 5,492,853.

[51] Int. Cl.$^6$ .......................... H01L 27/108; H01L 29/78
[52] U.S. Cl. ...................... 257/303; 257/297; 257/304; 257/305
[58] Field of Search ..................... 257/301, 303–305, 257/297

[56] References Cited

U.S. PATENT DOCUMENTS

| | | | |
|---|---|---|---|
| 4,794,563 | 12/1988 | Maeda | 257/303 |
| 4,918,500 | 4/1990 | Inuishi | 257/303 |
| 5,041,887 | 8/1991 | Kumagai et al. | 257/303 |
| 5,410,169 | 4/1995 | Yamamoto et al. | 257/305 |
| 5,416,348 | 5/1995 | Jeng | 257/303 |

Primary Examiner—Gene M. Munson

[57] ABSTRACT

A structure and process for forming a contact to a semiconductor substrate on a semiconductor device comprises the step of forming a patterned mask over a semiconductor substrate and over a field oxide region, then etching the semiconductor substrate and the field oxide region to form a trench. The trench comprises a bottom and a first sidewall consisting of silicon and a second sidewall comprising field oxide. The etching step removes a part of a doped region in the substrate. Next, a blanket nitride layer and a blanket oxide layer is formed over the substrate, and a spacer etch is performed on the nitride and oxide layer leaving nitride and oxide over the first and second sidewalls. The trench bottom is oxidized to form a layer of oxide over the bottom of the trench thereby insulating the trench bottom, and the oxide encroaches under the nitride and oxide on the sidewalls to join with the field oxide. The nitride and oxide is removed from the sidewalls, and a conductive layer is formed over the exposed trench sidewalls, the trench bottom being insulated from the conductive layer by the oxide layer over the bottom of the trench. The oxide on the bottom of the trench contacts the field oxide. The contact is isolated from the substrate along the trench bottom and the second sidewall, making contact with the substrate only in the area of the first sidewall.

8 Claims, 4 Drawing Sheets

CONTACT-SUBSTRATE FOR A SEMICONDUCTOR DEVICE COMPRISING A CONTOUR

This is a division of application Ser. No. 08/209,584, filed Mar. 11, 1994, issued Feb. 20, 1996 as U.S. Pat. No. 5,492,853.

FIELD OF THE INVENTION

This invention relates to the field of semiconductor manufacture, and more particularly to the formation of a contact to a semiconductor substrate.

BACKGROUND OF THE INVENTION

Many types of semiconductor devices such as microprocessors, and memories such as dynamic random access memories (DRAMs), static rams (SRAMs), and programmable read-only memories (PROMs) are formed in much the same way. Layers of oxide, nitride, and polycrystalline silicon (polysilicon or poly) are formed over a substrate such as monocrystalline silicon or gallium arsenide to form field and gate oxide, capacitor cell plates, word and digit lines, and various other structures.

One structure commonly formed during the manufacture of a semiconductor device such as a DRAM is a buried contact to a highly doped source (drain) area of the substrate such as that in FIGS. 1 and 2. FIG. 1 is a cross-section showing a semiconductor substrate 10 doped to a P- conductivity and a region of field oxide 12 overlying the substrate 10. An insulation layer 14 such as tetraethyl orthosilicate (TEOS) or other insulator surrounds a transistor gate 16, manufactured from a material such as doped polycrystalline silicon (poly). A mask 18 over the substrate 10 defines the etch area by protecting some regions while leaving other regions exposed. The P- substrate as shown has been lightly doped to form an N- active area 20 therein. To form the contact, an anisotropic (vertical) etch, for example, is performed on the FIG. 1 structure to remove the exposed material down the substrate. The mask is removed, and a layer of contact material 22, for example doped or undoped poly, is formed over the substrate 10 to make contact with the substrate in the contact region as shown in FIG. 2. An insulation layer (not shown) such as oxide or nitride and another conductive layer (not shown) can be formed over the first poly layer to form a storage cell having first and second capacitor cell plates and a buried contact according to means known in the art.

A transistor formed in this manner is known to have associated problems. For example, the charge can leak from the storage cell to the substrate through the buried contact junction which requires a frequent charge refresh to retain a correct data bit in the cell. This charge leakage problem is often associated with the electrical field across the junction, which depends on the doping profile near the junction. The cell leakage characteristic is thermal cycle sensitive, and any subsequent thermal cycle during processing can change the cell leakage characteristic.

A method of contact formation, and the structure resulting therefrom, which has fewer problems from diffusion and leakage would be desirable.

SUMMARY OF THE INVENTION

A process for forming a semiconductor device comprises forming a patterned mask over a semiconductor substrate and over a field oxide region, and etching the semiconductor substrate and the field oxide region to form a trench therein. The trench comprises a bottom and a first sidewall consisting of silicon and a second sidewall comprising field oxide. A protective layer is formed over the first and second sidewalls. The trench bottom is oxidized to form a layer of oxide over the bottom of the trench, thereby insulating the trench bottom, the layer of oxide contacting the second sidewall.

Next, the protective layer is removed from the trench sidewalls, and the trench sidewalls are exposed. A conductive layer is formed over the exposed trench sidewalls, the trench bottom being insulated from the conductive layer by the oxide on the trench bottom.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
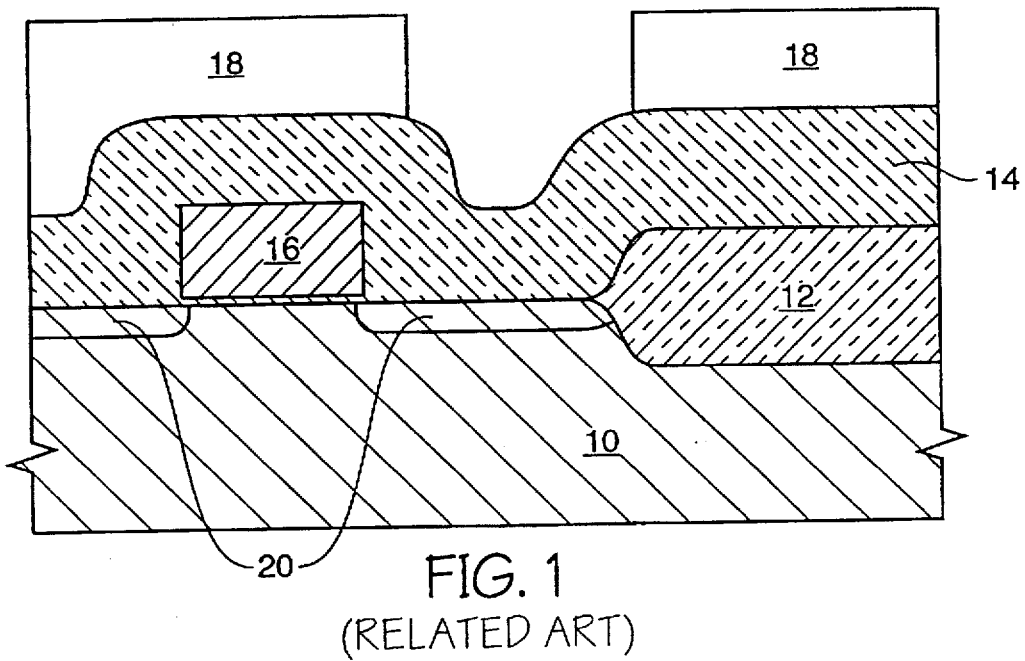
FIG. 1 is a cross-section showing a first step to manufacture a conventional contact.
Figure 2:
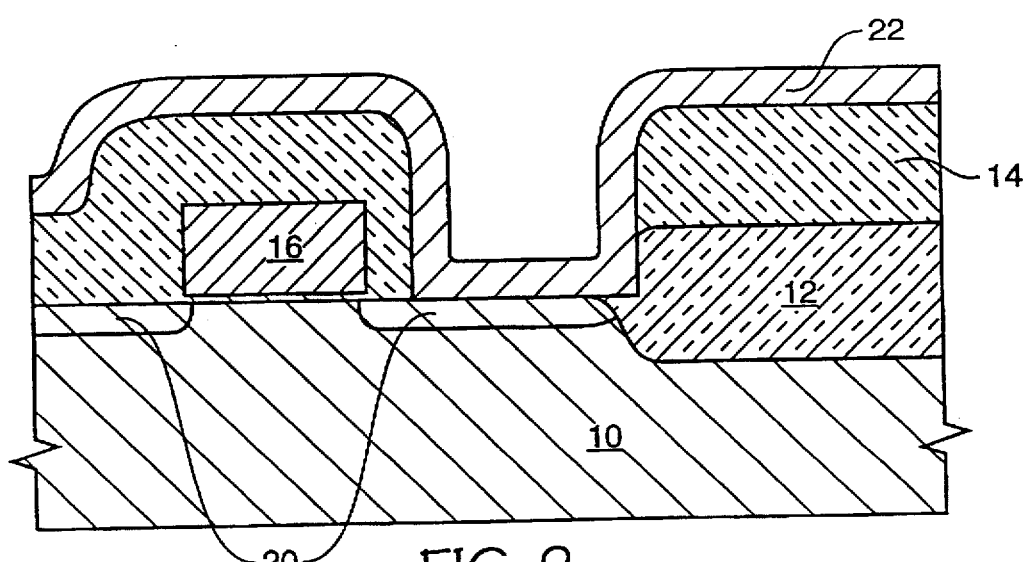
FIG. 2 is a cross-section showing the structure of FIG. 1 after an etch and the addition of a conductive layer.

One embodiment of the inventive process to form a semiconductor device is shown in FIGS. 3–7. The starting structure of FIG. 1 is formed according to means known in the art. This structure comprises a semiconductor substrate 10 having a field oxide layer 12, a transistor gate 16, for example comprising doped polycrystalline silicon, and an insulating layer 14 formed thereover. A patterned mask 18, for example photoresist, is formed over the semiconductor substrate 10 and over a field oxide region 12. A doped area 20 within the substrate 10 forms part of an active area, a portion to which contact is to be made.

Figure 3:
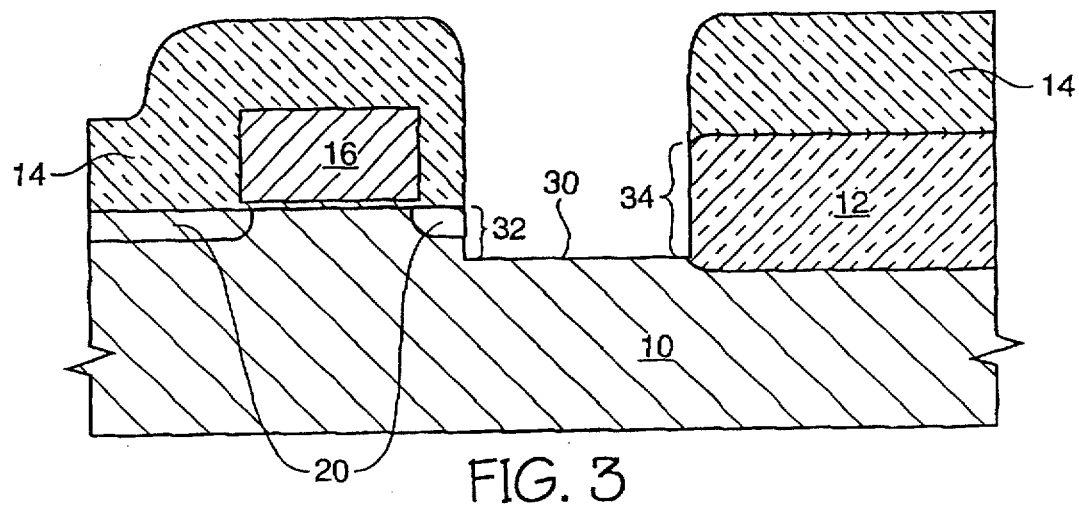
FIG. 3 is a cross-section of a first step of one embodiment of the invention to produce an inventive contact.
Figure 4:
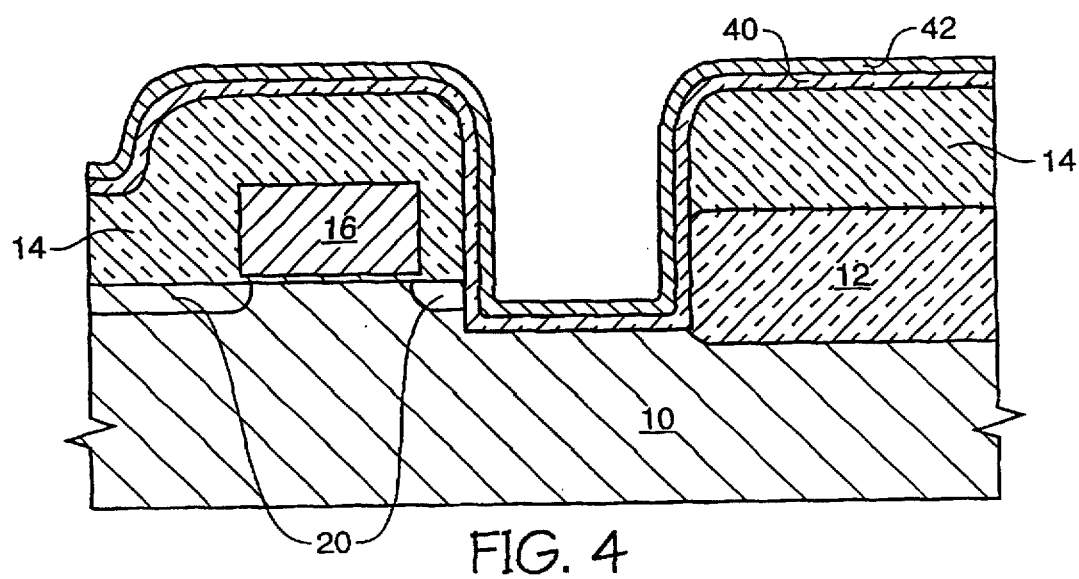
FIG. 4 shows the FIG. 3 structure after the addition of an oxide layer and a nitride layer.
Figure 5:
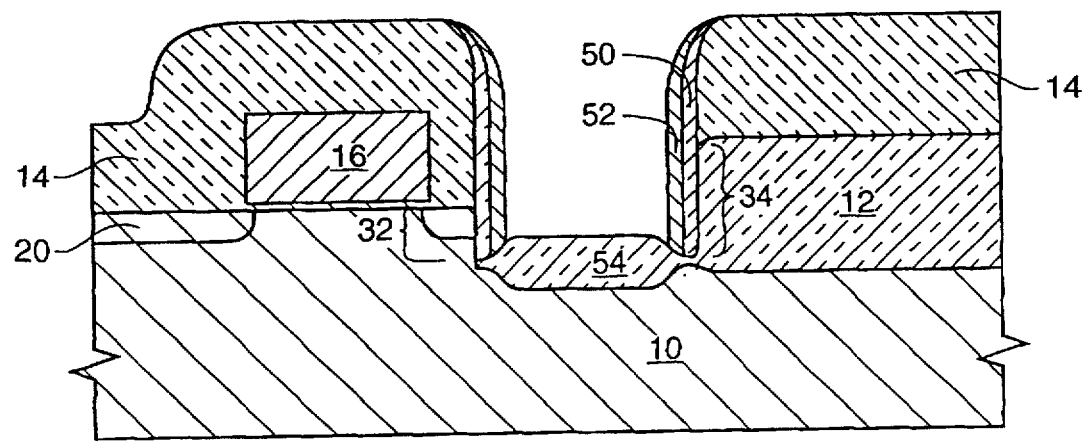
FIG. 5 shows the in process structure of FIG. 4 after an etch of the oxide and nitride layers and an oxidization of the exposed substrate.

Next, as shown in FIG. 3, an anisotropic etch is performed which removes the exposed oxide 14, the exposed field oxide 12, and a portion of the exposed substrate 10. This etch forms in the substrate 10 and the field oxide 12 a trench, the trench having a bottom 30 and a first sidewall 32 consisting of silicon and a second sidewall 34 consisting of field oxide 12. The trench can be from about 100 Å to about 3000 Å deep, although other trench depths may function adequately depending on the design of the cell and the depth of the diffusion layer. The etch of the substrate 10 removes a portion of the doped region 20 in the substrate 10 which is not covered by the mask, but stops so that the bottom 30 of the trench is above a bottom 36 of the field oxide 12. That is, the level of the trench bottom is below the bottom of the doped region in the substrate, but is above the lowest point of the field oxide. A thin blanket layer of oxide 40 is then thermally grown over the substrate 10, and a blanket layer of protective material 42 such as nitride is formed over the blanket oxide layer 40. The oxide layer 40 repairs damage imparted to the first sidewall 32 during the trench etch, and reduces stress to the sidewall during the subsequent oxidation on the bottom of the trench. The protective layer reduces the formation of oxide thereunder. In some cases, the oxide layer 40 may be omitted if trench damage is not a concern. With the inclusion of the oxide layer 40, the structure of FIG. 4 results.

An anisotropic etch such as a spacer etch is performed. The etch results in an oxide layer 50 and a protective layer 52 formed over the trench sidewalls 32,34, and at least a portion of the trench bottom is left exposed. A layer of oxide 54 is formed over the bottom of the trench by oxidizing the trench bottom, thereby insulating the trench bottom. The spacer etch and oxidizing the trench bottom results in the structure of FIG. 5. The oxide 54 on the bottom of the trench must be thick enough to insulate the trench bottom after removal of the protective layer 52 and the oxide 50 from the sidewalls in a subsequent step, which may also remove a portion of the oxide 54 from the trench bottom. As the bottom of the trench is oxidized, the oxide encroaches under the protective layer 52 and the oxide 50 on the sidewalls, and joins with the field oxide 12 thereby insulating the trench on the side of the field oxide.

Figure 6:
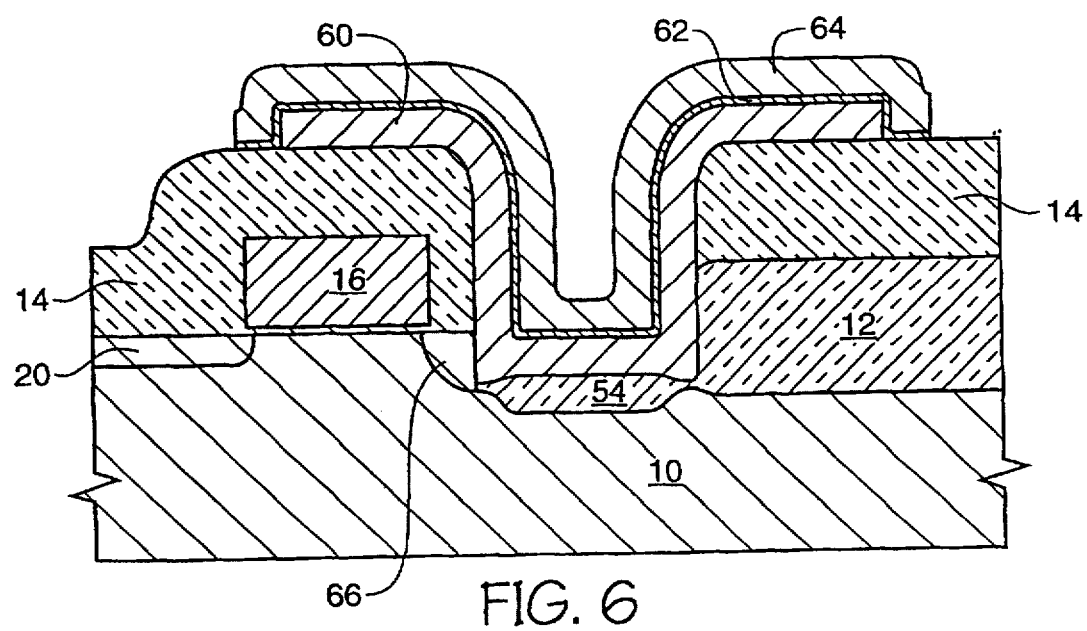
FIG. 6 shows the FIG. 5 structure after the sidewalls have been exposed and after the formation of a storage cell.

Next, the protective 52 and the oxide 50 layers which cover the sidewalls 32,34 are removed from the trench silicon sidewall 32, for example by an isotropic etch such as a wet etch, thereby exposing the silicon sidewall 32 for electrical conduction between a storage cell and the diffusion region 20 below the gate 16. This removal step also removes a portion of the insulation 54 on the trench bottom, and therefore the insulation on the trench bottom must be thick enough to withstand the etch. Any thickness of oxide 54 which provides adequate protection from leakage of the charge from the storage cell to the substrate would be sufficient, for example 50 Å or thicker. A conductive layer 60, for example of doped polycrystalline silicon, is then formed over the exposed trench sidewalls. The trench bottom is insulated from the conductive layer by the oxide layer formed over the trench bottom as shown in FIG. 6. FIG. 6 shows the addition of an insulation layer 62 and another conductive layer 64, thereby forming two insulated capacitor storage cell plates.

Figure 7:
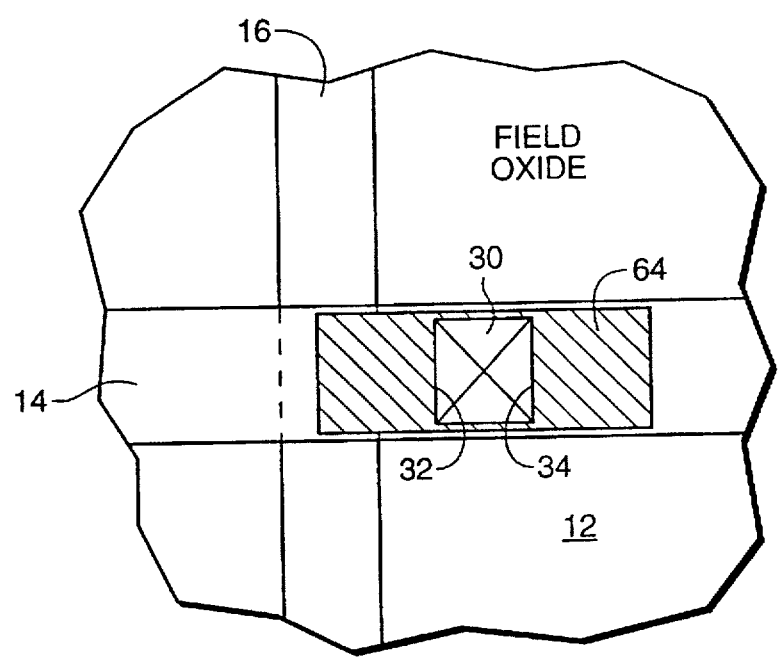
FIG. 7 is a plan view of the FIG. 6 structure.

The joining of the oxide 54 over the bottom of the trench and the field oxide 12 prevents the conductive material 60 from making contact with the substrate 10 on the field oxide side 34 of the trench and therefore reduces the problems associated with junction isolation. Contact between the substrate and the conductive layer is made primarily through the sidewall 32 on the gate side. With the removal of the portion of the doped active area by the etching of the substrate to form the trench, the area along which leakage can occur is greatly reduced. In addition, the oxide 54 acts as a diffusion barrier. Diffusion can occur, however, from the poly of the storage cell to the substrate to result in a portion of the P- substrate becoming N-, thereby changing the shape of the N- area 66 and improving the electrical characteristics of the cell. FIG. 7 shows a plan view of the FIG. 6 structure.

During the substrate etch step, the etch may remove all the field oxide not covered by the mask, and begin etching into the substrate. The second sidewall, therefore, may comprise both field oxide and silicon. The trench bottom may be above the bottom of the field oxide, or the trench bottom might extend to a level below the bottom of the field oxide. If this occurs, encroachment during oxidization of the trench bottom must oxidize the silicon portion of the sidewall to join with the field oxide. This alternate embodiment is therefore equivalent to the first, and a similar functioning structure remains after this alternate process embodiment.

The inventive structure resulting from the inventive process comprises a substrate trench having a bottom and a first sidewall integral to the bottom. The bottom and first sidewall consist of silicon. A second sidewall opposite the first sidewall is at so integral to the bottom, and consists of oxide, and is shown as field oxide. The doped region in the substrate is at the first sidewall as shown in FIG. 6. An oxide layer covers the bottom and contacts the oxide of the second sidewall. The conductive layer is formed over the first and second sidewalls and the bottom and is insulated from the bottom by the oxide layer covering the bottom. The conductive layer makes electrical contact with the substrate at the first sidewall, and further is insulated from the bottom by the oxide layer covering the bottom.

As described previously, the trench bottom is at a level below a bottom of the doped region in the first sidewall and is above a lowest point of the field oxide. As shown, the conductive layer contacts the doped region only at the first sidewall.

While this invention has been described with reference to illustrative embodiments to form a buried contact during dynamic random access formation, this description is not meant to be construed in a limiting sense. Various modifications of the illustrative embodiments, as well as additional embodiments of the invention, will be apparent to persons skilled in the art upon reference to this description. For example, the contact as described would function with any number of structures. The contact formation between the transistor gate and the field oxide is for illustration only. A contact formed from a conductive layer to the substrate between two transistor gates, or at any other location on a semiconductor surface, is within the scope of the invention as claimed. It is therefore contemplated that the appended claims will cover any such modifications or embodiments as fall within the true scope of the invention.

What is claimed is:

1. An in-process semiconductor device comprising:
   a substrate assembly contour having a bottom and a first sidewall portion intersecting said bottom, said bottom and said first sidewall portion comprising silicon;
   a second sidewall portion comprising a first oxide layer;
   a protective layer formed over said second sidewall portion; and
   a second oxide layer overlying said bottom and encroaching under said protective layer formed over said second sidewall portion and contacting said first oxide layer.

2. The device of claim 1 further comprising a protective layer formed over said first sidewall portion, said second oxide layer encroaching under said protective layer formed over said first sidewall portion and contacting said silicon.

3. The device of claim 2 wherein said protective layer comprises nitride.

4. The device of claim 2 further comprising a third oxide layer interposed between said first sidewall portion and said protective layer formed over said first sidewall portion.

5. The device of claim 2 wherein said first oxide layer is field oxide.

6. The device of claim 1 further comprising a third oxide layer interposed between said protective layer and said second sidewall portion wherein said second oxide layer is substantially thicker than said third oxide layer.

7. The device of claim 1 wherein said first oxide layer is field oxide and said protective layer contacts said field oxide.

8. An in-process semiconductor device comprising:

a trench formed in a semiconductor substrate assembly, said trench comprising a bottom, a first sidewall comprising silicon and a second sidewall comprising a first oxide layer having a first thickness;

an oxidation-resistant layer formed on said first and second sidewalls; and a second oxide overlying said bottom having a second thickness substantially less than said first thickness.

* * * * *